US011723296B2

(12) United States Patent
Brown et al.

(10) Patent No.: US 11,723,296 B2
(45) Date of Patent: Aug. 8, 2023

(54) STORAGE RING QUANTUM COMPUTER

(71) Applicant: United States Department of Energy, Washington, DC (US)

(72) Inventors: Kevin Brown, Stony Brook, NY (US); Thomas Roser, Huntington, NY (US)

(73) Assignee: U.S. Department of Energy, Washington, DC (US)

( * ) Notice: Subject to any disclaimer, the term of this patent is extended or adjusted under 35 U.S.C. 154(b) by 186 days.

(21) Appl. No.: 16/864,332

(22) Filed: May 1, 2020

(65) Prior Publication Data
US 2021/0343939 A1 Nov. 4, 2021

(51) Int. Cl.
*G11C 16/04* (2006.01)
*H01L 49/00* (2006.01)
*G06N 10/00* (2022.01)
*G11C 11/54* (2006.01)

(52) U.S. Cl.
CPC ........... *H01L 49/006* (2013.01); *G06N 10/00* (2019.01); *G11C 11/54* (2013.01)

(58) Field of Classification Search
CPC ........ G11C 11/54; G06N 10/00; H01L 49/006
See application file for complete search history.

(56) References Cited

U.S. PATENT DOCUMENTS

| 4,491,948 | A | * | 1/1985 | Deacon | H01S 3/0903 372/2 |
| 5,323,344 | A | * | 6/1994 | Katayama | B82Y 10/00 365/162 |
| 7,042,004 | B2 | * | 5/2006 | Magnus | B82Y 10/00 257/31 |
| 8,003,410 | B2 | * | 8/2011 | Kerner | G11C 11/44 438/2 |
| 8,284,585 | B2 | * | 10/2012 | Maekawa | B82Y 10/00 365/129 |

* cited by examiner

*Primary Examiner* — Pho M Luu
(74) *Attorney, Agent, or Firm* — Timothy L. Harney; Daniel Park; Brian J. Lally

(57) ABSTRACT

A system and method for storing information in a quantum computer using a quantum storage ring. The method comprises cooling ions in the quantum storage ring to a low temperature; and binding the ions into a lattice structure, forming an ion Coulomb crystal.

15 Claims, 3 Drawing Sheets

STORAGE RING QUANTUM COMPUTER

GOVERNMENT INTEREST

The United States Government has rights in this invention pursuant to Contract Number DE-SCOO12704 between the U.S. Department of Energy and Brookhaven National Laboratory.

FIELD OF THE INVENTION

The disclosure provides a system and method for storage for a computer system. More specifically, one or more embodiments relate to particle beam storage rings for quantum computers.

BACKGROUND

The disclosure relates to a system and method for storing information in a quantum computer using a quantum storage ring. The system and method include cooling ions in the quantum storage ring; and binding the ions into a lattice structure, forming an ion Coulomb crystal.

In classic computing technologies, a binary digit is characterized as either a 1 or 0 and is used to represent information. More specifically computer technologies use one of two levels of DC voltage to represent the 1 or 0 (alternatively referred to as a processed bit).

Quantum mechanics is a fundamental theory of physics which describes nature at the atomic and subatomic scale. Quantum computing uses quantum mechanical phenomena such as superposition and entanglement to perform computations using a computer called a quantum computer. In quantum computing quantum bits or qubits are fundamental to quantum computing and are somewhat analogous to bits in classical computing. Qubits may be in a 1 or 0 quantum state. But they can also be in a superposition of the 1 and 0 states. However, when qubits are measured, the result is always either a 0 or a 1; the probabilities of the two outcomes depends on the quantum state they were in.

One important element in building a storage ring quantum computer is to cool the ions and create a supercooled Coulomb crystal. A Coulomb crystal is a chain of ions bound into a lattice structure in which they remain locked in sequence by the mutual Coulomb repulsion force, as they are all positively charged. A supercooled Coulomb crystal is one that has been cooled to an extremely low temperature, where the thermal vibrations of the ions have been reduced to such a small level that the quantum states in the motion of the ions are easily observable. The challenge in going to a large number of qubits is that each additional ion in the chain adds three new vibrational states that must be controlled.

The main difference between an ion trap, or Paul trap, and a storage ring, is the ions in an ion trap have zero average velocity while the ions in the storage ring have some finite fixed average velocity.

Particle accelerator storage rings are instruments that store charged particle beams. The beams, if not cooled, may have very high temperatures and may be treated as classical thermodynamic ensembles of particles confined to some volume. When stored, either as bunches of particles or debunched into a uniform longitudinal (temporal) distribution, the particles are in a steady state and have constant entropy. In general, such a beam has no specific structure and should act like an ideal gas. However, the particles are necessarily charged and may interact with each other through intrabeam collisions and other phenomena. These processes can cause beam heating, increasing the entropy. In addition, these particle distributions do contain information encoded into the behavior of the beams as they traverse the magnetic optics that keep them confined within the storage ring.

For the purposes of this application, the language commonly used in the field of particle beams physics and documented in the Handbook of Accelerator Physics and Engineering.

It has been demonstrated that entropy and beam emittance are closely related, so the term emittance will be used herein.

Although temperature is not a term normally used in accelerator physics, it is a useful term when looking quantum phenomena and will prove important in determining required conditions for quantum mechanical processes to be exposed.

To bring a classical particle beam into a regime where quantum mechanical phenomena can be observed, it must be cooled to an extremely low temperature. Conventional beam temperature for a particle beam is defined from the rms single component momentum deviation of the particle distribution. The four-dimensional x, $p_x$, y, $p_y$ distribution, with $$p_x = \beta \gamma m_0 c x',$$

describes a region of space in which the particles are defined as $$\epsilon_x = 4\pi(\langle x^2 \rangle \langle x'^2 \rangle - \langle xx' \rangle^2)^{\frac{1}{2}}, \quad \text{Equation 1}$$

where $\epsilon_x$ represents the horizontal beam emittance. The transverse beam temperature is defined as the temperature associated with the transverse emittance. However, the most effective cooling is done longitudinally, where the temperature is a function of the momentum spread, $$\tfrac{1}{2} k_B T = \tfrac{1}{2} m (\delta v)^2 \quad \text{Equation 2}$$

where $\delta v$ is the spread in velocity of the ions in the beam. In more practical units, temperatures for ion beams can be expressed as, $$T_\parallel [^\circ K.] = \frac{2}{k_B}\left(\frac{\delta p}{p_0}\right) E_0[\text{eV}] \quad \text{Equation 3}$$

$$T_{\perp x,y}[^\circ K.] = \frac{2}{k_B}\left(\frac{\epsilon_{x,y}[m - \text{rad}]}{\langle \beta_{x,y} \rangle [m]}\right) E_0[\text{eV}], \quad \text{Equation 4}$$

where $T_\parallel$ is the longitudinal temperature
where $T_{\perp x,y}$ is the transverse temperature, $E_0$ is the average ion kinetic energy, and $\langle \beta_{x,y} \rangle$ is the average lattice beta function. Typically, beam dimensions are defined in terms of the rms value from a Gaussian distribution.

There are two basic states of matter that may be created by cooling the beams down to very low temperatures. The first is a classical crystalline beam, which is defined as "a cluster of circulating, charged particles in its classical lower-energy state subject to circumferentially varying guiding and focusing electro-magnetic forces and Coulomb interacting forces". The second state of matter is a super-cooled crystalline beam, or ion Coulomb crystal, that has been cooled to the point where the de Broglie wavelength is greater than or equal to the particle thermal oscillation amplitude.

There are a number of basic quantum properties that may be exploited using standard measurement techniques; the spin states of the particles, the particle/wave duality state of each particles wave function, the modes in the crystalline orbit, and the quantization in the emittance. These quantum properties are difficult to set and so are not useful for computational purposes.

A significant challenge in quantum computing is controlling quantum decoherence. An advantage of a storage ring-based system is that a large number of quantum bits (qubits) can be created and collectively isolated from outside noise sources. It is possible that even inside the storage ring system, groups of smaller numbers of qubits can be isolated from each other. The scaling of the number of qubits (N) is limited mostly to internal interactions. The problem of decoherence, nevertheless, remains, since not all ions in the crystalline beam can be operated on simultaneously. The larger N is, the longer the coherence time needs to be, although it may be managed by carefully designed algorithms. The major problems seen in ion traps remain concerns for a crystalline beam in a storage ring; spontaneous transitions in the vibrational motion, thermal radiation, and instabilities in various systems (i.e., laser power, rf voltages, and mechanical vibrations).

Ion trap systems exploit two quantum properties of the ions in the trap, the axial center-of-mass motion of the string of ions in the trap and the internal eigenstates of each ion in the string. The ion trap quantum properties can be used to define a set of computational basis states that can be operated on using laser excitations.

One embodiment relates to a new kind of quantum computer; a storage ring containing many positively charged ions, from which a large number of quantum bits of information, or qubits is obtained. The largest quantum computing systems today create dozens of useable qubits. A storage ring quantum computer will contain thousands of qubits, with the potential of scaling into the tens of thousands or even higher.

There is an urgent need for storing information in a quantum computer.

These and other objects, aspects, and advantages of the present disclosure will become better understood with reference to the accompanying description and claims.

SUMMARY

One or more embodiments relate to storage rings for quantum computers. More specifically, one embodiment relates to a method of storing information in a quantum computer using a quantum storage ring. The method includes cooling ions in the quantum storage ring to a low temperature; and binding the ions into a lattice structure, forming an ion Coulomb crystal.

One or more embodiments includes the low temperature is about $5.15 \times 10^{-5}$° K, where the ions are cooled to a low temperature using one or more lasers.

Another embodiment relates to a quantum storage ring. The quantum storage ring includes a containment about 1 meter in diameter; and electrodes adapted to be excited with RF signals.

Yet another embodiment relates to a quantum computer having a storage device. The computer includes a containment in the shape of a ring about 1 meter in diameter, and four electrodes adapted to be excited with RF.

One or more embodiments relates to a four electrodes. Embodiments include at least one laser for cooling ions in the storage ring such that thermal vibrations of ions are cooled to an extremely low temperature, so that the quantum states in motion of the ions are observable. Additional embodiment includes at least one laser comprises at least one of a Doppler and Raman laser. Additionally, the at least one laser provides sideband cooling for confined ions.

Various embodiments of the system and methodology disclosed are further demonstrated and described in the following description.

DETAILED DESCRIPTION

Figure 1:
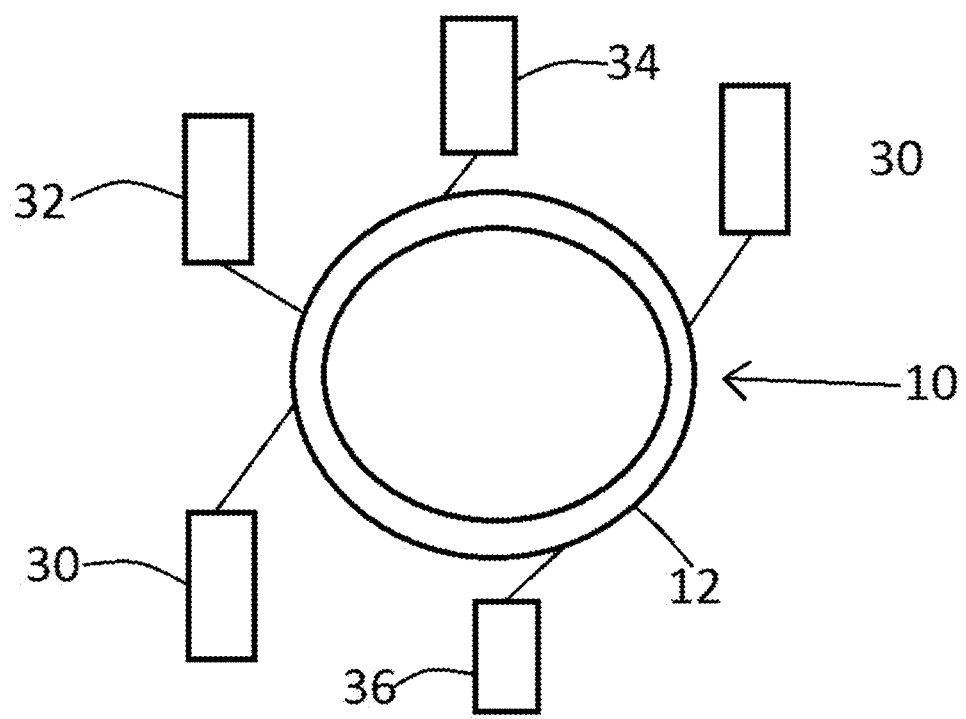
FIG. 1 depicts a block diagram of a storage ring in accordance with one embodiment of the present invention.

The following description is provided to enable any person skilled in the art to use the invention and sets forth the best mode contemplated by the inventor for carrying out the invention. Various modifications, however, will remain readily apparent to those skilled in the art, since the principles of the present invention are defined herein specifically to provide a system and methodology for In the field of accelerators and beams, the concept of building a quantum computer using a particle beam storage ring is novel and has never been attempted. There has been extensive study of quantum effects in particle beam dynamics, which is described below. The creation of crystalline beams has been studied since the 1980's. Such beams represent a new state of matter that has not been extensively studied experimentally.

In the field of quantum computing, there are many kinds of quantum computers, each of which have their own challenges and limitations. It is generally accepted that a practical quantum computer be something that is scalable, have mechanisms for initialization, allow operations within limiting decoherence times, allow for a universal set of operations, and allow quantum bits to be easily read.

It is worth noting that in the field of quantum computing, increasing the number of qubits isn't necessarily going to lead to greater computational efficiency or linear scaling. This is especially true if the primary goal is to fight decoherence or look to find ways to hold' quantum states (e.g., quantum cavity). Also, the number of qubits defines the dimensionality in a Hilbert space representing all the possible states in the quantum system. A quantum computer with N qubits can hold $2^N$ numbers, in a quantum superposition of mutually orthogonal states. How to manage the computational efficiency with large N needs to be understood.

Quantum computers that might be compared to a storage ring system would be those that attempt to operate at the atomic level. A trapped ion quantum computer will confine ions or other charged particles in some free space using electromagnetic fields. The qubits are the quantum states associated with each ion. Ion trap systems are scalable and hold much promise as quantum computing systems. A storage ring system is very similar to an ion trap. A significant difference is the particles will be confined into a circular magnetic guide. Storage ring ions will have finite average velocities, although velocity is a free parameter that can be optimized. Ions in a storage ring can be entangled, as they can in an ion trap. Nuclear Magnet Resonance (NMR) quantum computing has been explored experimentally and is the first system to demonstrate Shor's algorithm.

A classical crystalline beam is formed by cooling the beam sufficiently to a point where the charged particles "lock into" a structure in which repelling Coulomb forces balance against external forces. This transforms the basic ideal gas particle beam distribution into a new form of matter, a chain of particles locked into a sequence in much the way atoms get locked into a lattice in a crystal. These types of beams have been extensively studied theoretically and to some extent experimentally.

The separation of the particles in a crystal scales on the order of $$v_{eff}^{-2/3}\xi,$$

where $$\xi$$

is called the characteristic distance, $$\xi = (q^2 r_0 \rho^2 / A \beta^2 \gamma^2)^{1/3}, \quad \text{Equation 5}$$

where $q$:

is the charge, $A$ is the atomic number, where $r_0$ is the classical particle radius, where $\rho$ is the average bending radius in the storage ring lattice where $\beta, \gamma,$ are the relativistic factors, and $$v_{eff}^2 = \min(v_y^2, v_x^2 - \gamma^2), \quad \text{Equation 6}$$

where $v_x$ and $v_y$ are the betatron oscillations resulting from the focusing structure of the accelerator, in the horizontal and vertical planes, respectively. Note that this scaling is just a rough estimation of the distance between the ions of the crystal. A more precise description of the crystal structure will be discussed later, using the Wigner-Seitz radius, which defines the density of the crystal based on the secular motion of the ions in the crystal.

It is possible to extract quantum information from classical crystalline beams. For example, a particle beam may be composed of an equal distribution of up and down spin states. Once a beam is "frozen" into a crystal structure a random sequence of spin states will be created. If each of these spin states could be measured, then each one could be treated as a single qubit. A storage ring 1 m in circumference, with ions in the crystal spaced by 10 μm could contain up to 100,000 potential qubits. The throughput is determined by the time it takes to set and measure the quantum states. It is contemplated that polarized particle beams may be used to control the distribution of the up and down spin states.

Another kind of quantum information could be extracted by exciting beam echoes on a crystal beam. For example, if each point particle is seen as a wave packet in an equilibrium distribution in phase space with rms size $\sigma,$ then all wave packets will be displaced by quantum mechanical ground states. If $\sigma$ is sufficiently small, then the quantum mechanical contribution to beam emittance could be observed.

$$\epsilon = m\omega\sigma^2 + \tfrac{1}{2}\hbar \quad \text{Equation 7}$$

The quantum information extracted here is a single excitation value from higher order moments in the centroid motion of the crystal. Each measured moment could be treated as a qubit, where the value is dependent on the temperature of the beam. In such situation, the number of qubits is built through the throughput of the storage ring cycle, which could be very fast, constrained only be the time to measure the moments in the beam echo signal. This is essentially a classical crystalline method to the use of center-of-mass quantum modes, which will be discussed below. To use this as a computational basis, the states must be initialized.

To control the state of the ions in a classical crystalline beam would be difficult, since the standard methods, developed for ion traps, require the vibration states of the ions to be very small.

The de Broglie wavelength of a high energy particle is $$\lambda = \hbar/p_\perp \le \lambda_c \sqrt{\frac{\beta}{\gamma \epsilon_n}}, \quad \text{Equation 8}$$

where $$\lambda_c = \hbar c/mc^2$$

is the Compton wavelength. The de Broglie wavelength, in the beam rest frame, when equal to the highest phonon frequency, where $$\max(\omega_{ph}) = \sqrt{2}\gamma\omega\beta.$$

marks the point in which external quantum modes become observable and vibration states become small enough that internal quantum states can be manipulated.

$$\frac{\hbar}{2}\max(\omega_{ph}) \approx \frac{kT_B}{2} \quad \text{Equation 9}$$

To get to this state, the beam cooling systems need to bring the temperature down by as much as an additional factor of $10^4$, roughly (e.g., from 100° mK to 10°μK.) To cool beams down to this level may require additional systems that remove all sources of noise that can add heat to the beams, such as cryogenically cooled beam pipes and vibration compensation systems. Most importantly, though, the lattice structure of the accelerator will need to be carefully designed to reduce lattice shear and the large perturbations that an alternating gradient (AG) structure impose on the beams.

One example of a storage ring for crystalline beams was exposed using the Paul Laser cooling Accelerator System (PALLAS) FR quadrupole ring at LMU Munich.

In the PALLAS experiments, $^{24}Mg^+$ ion beams were observed with $$\beta c \approx 10^{-5} c$$

transition into a crystalline state for both coasting beams and bunched beams. The issues in controlling and maintaining the crystalline structure were related to the modulation of the beam envelope due to the alternating gradient fields and velocity dependent shear forces. It was observed that the coupling driven by the transverse motion into thermal motion set an upper limit to the confinement strength. This limit was observed to be a factor of three greater than the criterion that the lattice periodicity be greater than $$2\sqrt{2} v_{eff}.$$

Ion trap systems work within a regime in which center-of-mass vibrational degrees of freedom (phonon states) can be operated on as a computational basis of states. Ion trap systems also slow ions down to a point in which each ion is vibrating in a fixed spatial region in the chain of ions in the trap. A storage ring system would be established as a similar state, but in a rotating frame. The crystal would rotate at a fixed frequency with all ions vibrating within a small region of space in that frame. This means the spacing of the ions would be fixed and stable, to a level that a set of laser systems, for example, could excite internal ion states and external crystal states.

PALLAS and S-LSR were two facilities that have studied crystalline beams and explored what conditions are best for creating this state of matter for those given lattices. Super-cooled Coulomb-crystalline beams were not studied.

The PALLAS ring was a circular radio frequency quadrupole (RFQ) ring. The formalism adopted by Schramm and Habs are discussed below.

The azimuthal motion of the ions is an angular precession at the frequency, $$\omega_0 = \beta c/R, \qquad \text{Equation 10}$$

where $R$ is the radius of the curvature of the ring. The alternating focusing period is $$L = \beta \lambda,$$

where $$\lambda = c/f_{rf}$$

is the RF field wavelength and $\beta$ is the relativistic factor. Transverse motion in an rf quadrupole ring, when the bending radius is much larger than the aperture, may be described using the equations of motion for a linear rf quadrupole trap, where the periodicity is a function of the velocity.

$$P = \frac{C}{L} \qquad \text{Equation 11}$$

where $$C = 2\pi R \text{ and } L = v_0/f_{rf}$$

The rf quadrupole configuration has an electrical potential, $$\Phi(\hat{x}, \hat{y}, \hat{z}) = \frac{\Phi_0(t)}{2r_0}(\hat{x}^2 - \hat{y}^2), \qquad \text{Equation 12}$$

where an alternating potential is applied as, $$\Phi_0(t) = U_{dc} - U_{rf} \cos(\Omega t), \qquad \text{Equation 13}$$

where $U_{rf}$ is the rf voltage and $\Omega$ is the rf angular frequency. The equations of motion can be written in canonical form of a linear differential equation with periodic, variable coefficients (Mathien's differential equation).

$$\frac{d^2 u}{d\xi^2} + [b_u - 2q_u \cos(2\xi)]u = 0 \qquad \text{Equation 14}$$

where $$b = b_{\hat{x}} = -b_{\hat{y}} = \frac{4eU_{dc}}{m\Omega^2 r_0^2}, \qquad \text{Equation 15}$$

$$q = q_{\hat{x}} = -q_{\hat{y}} = \frac{2eU_{rf}}{m\Omega^2 r_0^2}, \qquad \text{Equation 16}$$

and $$\xi = \frac{1}{2}\Omega t \qquad \text{Equation 17}$$

The value of q represents the ratio of the potential to the kinetic energy of the driven motion. The stable motion in the transverse directions can be described by the secular frequency, $$\omega_{sec,u} = \beta_u \Omega/2. \qquad \text{Equation 18}$$

The value of $\beta_u$ depends on the trap parameters $q_u, b_u,$ are chosen to be in a region of weak confinement $(q \ll 1 \text{ and } b \leq q),$ where only the first term in the series of harmonics of the driving frequency dominates, so $$\omega_{sec} \approx q\Omega/\sqrt{8}. \qquad \text{Equation 19}$$

For axial confinement in a storage ring, a potential is applied to ring electrodes or by using biased sections at the ends of the quadrupole electrodes, $$\Phi_z(r,z) = \frac{\kappa U_{end}}{r_0^2}\left(x^2 - \frac{r^2}{2}\right) \qquad \text{Equation 20}$$

where $\kappa$ is a constant based on the geometry.

Given this description of an rf quadrupole storage ring, simple parameters can be denied that describes the general motion of the ions. The phase advanced per cell, in this structure, is $$\mu = \int_z^{z+L} \frac{1}{\omega(s)} ds = \frac{L}{\overline{\omega}^2} = 2\pi\frac{L}{\lambda_\beta}, \qquad \text{Equation 21}$$

where a smooth approximation is assumed in which the variation of the beam envelope over one focusing cell is small and the amplitude function $\omega(z)$ can be approximated by a mean value $\overline{\omega}$ and a small modulation (the micromotion in the rf driven system). The micromotion corresponds to an oscillation with a short wavelength of the focusing section, $L = \beta\lambda = 2\pi\upsilon_0/\Omega$ \qquad Equation 22

Where the secular motion is defined as, $\omega_{sec} \equiv \omega_\beta = 2\pi\upsilon_0/\lambda_\beta.$ \qquad Equation 23

$\lambda_\beta$ is the betatron wavelength. The beta-function and dispersion function can be exactly replaced by their mean values, for $\lambda_\beta >> L.$ For a storage ring rf quadrupole, there is a set of simple relations for describing the lattice structure.

Periodicity $P = C/L$

Tune $Q = C/\lambda_\beta = \omega_{sec} C/2\pi\upsilon_0$

Beta-function $\beta_0 = R/Q$ [m]

phase $\phi(z) = Qz/R$ dispersion $D_0 = R/Q^2$ [m]

momentum compaction $\alpha = D_0/R = 1/Q^2$ transition energy $\gamma_{tr} = Q$ \qquad Equation 24

The PALLAS ring is a 'table-top' size accelerator, with a radius, $R_0 = 57.5$ mm. For $^{24}Mg^+$ beams with velocities $\upsilon_0 = 1000\text{-}2500$ [m/s], it had cell lengths, $L = 0.16\text{-}0.4$ [mm], respectively, and periodicities, $P = 2272\text{-}910$, respectively. In this range, the tunes on are on the order of $Q \approx 60$ and the dispersion $D_0 \approx 1.6 \times 10^{-4}$ [m].

The periodicity is well above the criterion of $2\sqrt{2}\nu_{eff} = 170$ for the formation of crystalline beams. The RFQ ring leads to a highly symmetric lattice with smooth field variations and, experimentally, was effective in creating crystalline beams.

The S-LSR ring is a geometric AG storage ring with a circumference of 22.557 m. It was built for the purpose of studying methods of cooling ion beams. Such a structure suffers from "shear heating", in which momentum dispersion in the bending magnets causes angular velocity differences among the ions with different energies. This problem was studied in great detail. Two approaches may be used to suppress the shear. A tapered cooling system using a Wien filter allows cooling to take place in a lattice with finite dispersion. Another approach is to adopt a lattice with no linear dispersion using a dispersion suppression system. Such a system creates a cross-field of magnetic and electric fields. An electric field from a cylindrical electrostatic deflector is superimposed with the magnetic field, enhancing the radial focusing. By adjusting the focusing, the linear dispersion can be suppressed throughout the lattice.

Cooling a beam in a storage ring into the quantum regime has never been done. Most systems have studied the cooling of beams with fairly high velocities. Ion traps cool beams to stationary steady states. At PALLAS, it was discovered that bending shear prevented the creation of crystalline beams when the ions has $v \geq 2500$ [m/s].

One important condition is to ensure that for the ensemble of ions the ratio of the energy of the mutual Coulomb energy is high enough that the condition of Equation 9 can be established. If expressed using the unit-less plasma parameter $$\Lambda_p = \frac{1}{4\pi\epsilon_0} \frac{e^2}{a_{ws} k_B T} \qquad \text{Equation 25}$$

where $a_{ws}$ is the Wigner-Seitz radius, $$a_{ws} = \left[\frac{1}{4\pi\epsilon_0} \frac{3e^2}{2m\omega_{sec}^2)}\right]^{1/3}, \qquad \text{Equation 26}$$

and $\omega_{sec}$ is the secular frequency of the beam, given by $$\omega_{sec} = \frac{2eU_{rf}}{\sqrt{8}\, m\Omega r_0^2}, \qquad \text{Equation 27}$$

which is should be appreciated that, in addition to cooling to a low temperature, a beam with lower mass ions at a high rf potential can be used to make $\Lambda_p$ as large as possible.

To create the Coulomb crystalline beam, the temperature needs to be lowered to the point that thermal vibrations are small compared to the quantum phonon modes for the crystal. It the crystal is treated as just a chain of ions with equilibrium spacings (all equal) of a, the only force the ions see from each other is from the Coulomb potential of the neighboring ions $$U_C = \sum_j^N \frac{q^2}{m\sqrt{(x_j-x)^2 + (y_j-y)^2 + (z_j-z)^2}},$$ Equation 28 where N is the number of ions in the crystal. The potential seen by two adjacent ions separated by 10 μm is on the order of $3 \times 10^{-4}$ eV. This Coulomb potential energy is what determines the spring constant, $$K = (d^2 U/dr^2)_{r=a}$$

Between the ions that determines the axial phonon modes for the crystal. In a classical treatment, the angular frequency for the phonon modes goes as, $$\omega = \sqrt{\frac{4K}{m}} \sin(ka/2).$$ Equation 29

Here, k is the wave number $k=2\pi/\lambda$, and $\omega$ is a periodic function of k, symmetric with respect to k and $-k$ with its first period between $k=-\pi/a$ and $k=\pi/a$.

The maximum frequency will correspond to when $$\sin(ka/2) = 1.$$ Equation 30

$$\omega_{max} = \sqrt{\frac{4K}{m}}$$

If the Coulomb potential is used for ion spacings of 10 μm, it is determined that the $^{24}$Mg$^+$ crystalline beam.

$\omega_{max}$=6.74 MHz.

The quantum eigen values for the phonon modes are $$E_n = <n|H_{1D}|n> = \left(n + \frac{1}{2}\right)\hbar\omega$$ Equation 31

Where the one-dimensional Hamiltonian $H_{1D} = \hbar\omega(\alpha^\dagger \alpha + \frac{1}{2}).$ Equation 32

The annihilation operator (or lower operator) is, $$\alpha = \sqrt{\frac{m\omega}{2\hbar}}\zeta + i\sqrt{\frac{1}{2\hbar m\omega}}p,$$ Equation 33 and the creation operator (or raising operator) is, $$a^\dagger = \sqrt{\frac{m\omega}{2\hbar}}\zeta - i\sqrt{\frac{1}{2\hbar m\omega}}p, \text{ and,}$$ Equation 34

$[p,\zeta] = p\zeta - \zeta p = -i\hbar,$ Equation 35 where $\zeta$ and p represent the coordinate and momentum operators.

Returning to Equation 9, it is known that the temperature is directly proportional to the momentum spread in the beam and the average kinetic energy of beam. It should be appreciated that the estimate for what temperature is needed in order to create a Coulomb crystalline beam, given the value of $\omega_{max}$ for a beam with a=10 μm. The corresponding temperature is on the order of $5.15 \times 10^{-5\circ}$ K. This sets the scale for the range of values for $\delta p/p_0$ and the velocity of the ions. From Equation 3, it can be seen that the product $$\left(\frac{\delta p}{p_0}\right) E_0 = 5.15 \times 10^{-5} / 2.32 \times 10^4 = 2.22 \times 10^{-9}.$$

A beam with $E_0$=1 [eV], corresponding to a velocity of 2818 m/s, would have to be cooled to have a $\delta p/p_0 = 2.22 \times 10^{-9}$, which is very challenging. However, a beam with $E_0 = 10^{-4}$ [eV], with a velocity near 28 m/s, would have to be cooled to have a $\delta p/p_0 = 2.22 \times 10^{-5}$, So making the beam energy as low as possible will improve the ability to reach the low temperature needed to make a Coulomb crystalline beam.

Table 1 illustrates parameters used to create a Coulomb crystal. It is assumed that the beams are cooled to a level where the $\delta p/p$ is $10^{-7}$. Here the parameters for a PALLAS-like ring are recalculated to have a circumference of 1 m. All rings have the same circumference. Further, two basic constraints were applied; the value of P/Q be greater than 8.5 and the achieved temperature being equal to that corresponding to the maximum phonon frequency. This maximum temperature basically sets the maximum velocity of the beams. It should be appreciated that by increasing the circumference of the ring from 0.36 m to 1 m, the average dispersion is reduced by 1/0.36. Since the dispersion is velocity dependent, lowering the beam energy will reduce the velocity shear effect.

TABLE 1

| Parameter | $^{24}$Mg$^+$ | $^9$Be$^+$ | $^7$Li$^+$ | Units |
|---|---|---|---|---|
| $v_{max}$ | 420 | 885 | 1070 | m/sec |
| $f_{rf}$ | 6.3 | 12.6 | 12.6 | MHz |
| L | 67 | 70 | 85 | μm |
| P | 15000 | 14237 | 11776 | |
| Q | 1290 | 827 | 879 | |
| $D_0$ | $9.6 \times 10^{-8}$ | $2.3 \times 10^{-7}$ | $2.1 \times 10^{-7}$ | m |
| $T_{max}$ | 51 | 85 | 96 | μK |
| $\omega_{max}$ | 6.75 | 11.09 | 12.57 | MHz |
| $\Lambda_p$ | 35900 | 19200 | 18300 | |

Parameters needed to create a Coulomb crystal in a circular RF quadrupole for three different ions where it is assumed that cooling has achieved $\delta p/p = 10^{-7}$, all with a C=1 m ring.

Another parameter that affects the crystalline structure is the amount of transverse spread in the motion of the ions. This can be expressed as a focusing apparent plasma parameter, $$\Lambda_{app,f} \propto \frac{P^2}{\lambda Q^2}. \quad \text{Equation 36}$$

As with $\Lambda_p$, the larger this number the better the conditions are for a crystalline beam. So this suggests a larger $f_{rf}$, larger $r_0$, and smaller $U_{rf}$ are preferred. Immediately there is an obvious trade-off required on finding the optimal rf voltage.

Finally, the PALLAS results demonstrated that shear was what limited the formation of crystalline beams at higher velocities. Again, this can be expressed in terms of an apparent plasma parameter, $$\Lambda_{app,s} \propto \frac{Q^2}{\lambda}. \quad \text{Equation 37}$$

This is quadratically dependent on the velocity and the radius of the ring improves quadratically with increasing rf voltage and frequency and improves with smaller aperture.

Overall, the PALLAS experience demonstrates that to get to the quantum regime for crystalline beams it is better to use low mass ions, such as $^7Li^+$ or $^9Be^+$, at low velocities (e.g., 1≤υ≤100 [m/sec]).

Reducing the shear effect is an important element of one embodiment of the present invention.

Experience with ion traps has demonstrated that achieving a maximum switching rate for quantum computing, which is limited by the frequency and duration of the laser pulses, carefully configured to rotate an ions internal state without affecting the center-of-mass motional state, places further constraints on the system. Consider that the extent of the ground-state vibrational wave function, $\Delta z_{cm}$, is limited by the number of ions being acted upon, or, $$\Delta z_{cm} k_z = \left(\frac{\hbar k^2 \cos^2(\theta)}{2Nm\omega_z}\right)^{1/2} \equiv \frac{n}{\sqrt{N}}. \quad \text{Equation 38}$$

Here, $k_z = k\cos(\theta)$

Is the wave vector component along the z direction in the trap and $\eta$ is the Lambe-Dicke parameter for a single trapped ion. This can be expressed in terms of energy of the recoil of an ion after emission of a single photon.

$$\eta = \cos(\theta)(E_R/\hbar\omega_z)^{1/2}, \quad \text{Equation 39}$$

Where $E_R \equiv (\hbar k)^2/2\ m$.

The value of $\eta$ is a function of the vibrational states (through $\omega_z$) for the harmonic motion of the trapped ion. Since the ions are trapped in both radial and axial directions, there is a Lambe-Dicke parameter for radial confinement and a parameter for axial confinement. Radial confinement in a trap is stable as long as there is a balance between the potential and kinetic energy of the driven motion (q from equation 16 is less than 1). Radial micromotion has a velocity amplitude that is a function of this ratio and the distance particles deviate from the central axis. The Lambe-Dicke parameter for radial motion, is $$\eta_r = \left(\frac{2\sqrt{2}\,E_R k^2 r_0^2}{eU_{rf}}\right)^{1/4} \quad \text{Equation 40}$$

to establish a shape of a linear string, the radial confinement must be tighter than the axial confinement must be tighter than the axial confinement, requiring $\eta_r$ to be much smaller than 1. Likewise, axial confinement must be balanced and is controlled with a longitudinal potential.

From a practical perspective, the storage ring needs a location for injection of the ion beam, locations for beam cooling, a location to read and write the qubits, locations for diagnostic instrumentation, and locations to apply RF for axial confinement.

To achieve supercooled crystalline beams, a large sudden transients in the magnetic field lattice should be avoided, as the ions circulate in the storage ring. So the lattice should be highly repeatable with no straight sections (no missing dipole sections). A highly symmetric lattice, as with the circular RFQ, is required.

Use of longitudinal laser cooling has had success in ion traps. Transverse cooling through coupling has had some success, as well. To get below the Rabi limit, determined from the Rabi frequency for resonant excitation for Doppler cooling $\Omega_R^2 = 6\pi \Gamma I/\hbar c k^3$, where $\Gamma$ is the transition linewidth, $I$ is the excitation intensity, and $k$ is the wave vector, another cooling system is needed, such as Raman transition cooling. Note that a quantum computer should stay above the Lambe-Dicke limit, which will influence the amount of coupling between the internal quantum states and center-of-mass motion external quantum states. Electron and laser cooling are highly efficient for longitudinal cooling, but additional systems are needed to perform the transverse cooling. Stochastic cooling might be an option, although Schottky signal will disappear as the beams enter crystalline state. However, the use of null detection in ion fluorescence has been investigated as a way to employ stochastic cooling of trapped ions.

Employing a system for pre-cooling before injection may be advantageous, since it would enable making a finer momentum selection during injection, reducing shear effects. One method is to use a Zeeman slower/decelerator, where a magnetic field can change the resonance frequency using the Zeeman effect (splitting the spectral lines) to compensate for the ion momentum falling out of resonance with the optical pumping. This does have the effect of lowering the velocity of the ions.

Cooling crystalline beams as they approach a more ordered state becomes difficult, particularly when using sympathetic cooling. Coupling through a synchrobetatron resonance also is problematic as the beams approach the crystalline state. Tapered cooling is one method that could be provide effective 3-D cooling. This method provides ions with a constant angular velocity, by causing momentum to be a function of radial displacement. Tapered cooling and Wien filters are an area of active research.

Two constraining parameters will determine the efficiency of the storage ring as a quantum computer, switching rate and number of ions in the ion string (which, from the Mössbauer effect, has an effective mass, Nm where m is the single ion mass).

Switching rate has to do with how the ion trap information is processed, through the use of pulses of radiation at a given frequency and for a given duration. In the case of an ion trap, the ion vibrational states have spatial extents with a probability distribution that depends on the vibration states standard deviation. Vibrational state changing transitions are a function of this probability distribution as well as $$1/\sqrt{N},$$

since the string is moving as a single mass and the system must obey conservation of angular momentum.

There are a number of well understood methods to cool the ion beam. Laser cooling is very effective only for certain ion species and charge states (i.e., $^{24}Mg^+$, $^9Be^+$, $^7Li^+$, $C^{3+}$). Electron cooling can be very effective with low energy beams, but the electrons must match the ions in velocity extremely well. It can be employed with any ion beam. In general laser cooling techniques have succeeded in taking ion beams to very low temperatures (e.g. PALLAS and S-LSR).

The most common and simplest type of laser cooling is sideband cooling, for confined ions, or better known as Doppler cooling for free ions. In this process photons excite transitions that bring the ion's internal state back to the ground state. With continued excitations, on average the vibrational quantum number is reduced. What is important for this discussion is to note that in ion traps only a single ion is operated on by the laser. The string of ions in the trap are all being affected, since they are coupled through the Coulomb force between them.

Entanglement in an ion trap involves coupling the internal and external states of the ions. Through these couplings it is possible to create quantum computer gates. The methods used to create these couplings involve exploiting resonance conditions, in Raman transitions, for example, that lead to coherent interactions. In the simplest example, spin state transitions are accompanied by motional state transitions, by selecting a laser frequency that is a red or blue sideband of $\omega_0$, where spin states are seperated in energy by $\hbar\omega_0$. There are a number of schemes for mapping from spin qubits to motion qubits that allow the motional qubit to be used as a carrier transition to create gates, such as a controlled-not (CNOT) gate. Details of such schemes are well documented in the ion-trap literature. In the paragraphs below, some of the basic operations are outlined.

One or more methods employed in ion trap quantum computers can be employed in the storage ring quantum computer. The primary method of establishing a qubit involves excitation and measurement of hyperfine states.

As described in the literature, using $^9Be^+$ and the $^2S_{1/2}$ (F=2, $m_F$=2) and $^2S_{1/2}$(F=1, $m_F$=1) hyper-fine ground states (denoted $|\downarrow\rangle$ and $|\uparrow\rangle$, respectively), a practical qubit can be constructed. A polarized laser beam is tuned to the $$|\downarrow\rangle \rightarrow ^2P_{3/2}$$

transition near 313 nm and by observing the scattered photons two distinct spin states can be resolved well enough to determine the quantum states with almost 100% efficiency.

Another form of quantum information may be observed in the axial center-of-mass motion of the ions in an ion trap as discussed above. This axial motion has a frequence $\omega_z$, which is independent of the number of ions in the trap and is described by the vibrational eigenstates $$|n\rangle$$

with energy $$\hbar\omega_z(n+½),$$

where n is the vibrational index describing the number of phonons in the collective harmonic motion. The axial motion frequency, $\omega_z$, is a function of the trap potential, the dimensions of the trap, and the charge and mass of the trapped ion. To create quantum operations, internal energy eigenstates and center-of-mass motion are employed. Internal energy eigenstates are measured by observing the frequency of the radiation resulting from the technique of quantum jumps. For example, the two internal energy eigenstates $$|0,0\rangle \text{ and } |1,0\rangle$$

are separated in frequency by $$\hbar\omega_v,$$

Each of these internal states has an associated set of vibrational levels for each vibrational mode. The vibrational energy eigenstates are $$|n_1,n_2,n_3, \ldots \rangle,$$

where $n_i$ are the excitations of the various normal modes. The ground state is $$|0,0,0, \ldots \rangle$$

and the first excited state of the center-of-mass is $$|1,0,0, \ldots \rangle.$$

These then become the basis of the computation operations. Observing axial modes in an ion trap is done through coupling between internal and external vibration states by stimulated Raman transitions.

There are also radial vibration modes that depend on the lattice focusing. The modes will have a frequency on the order of $$2\pi\sqrt{2}\gamma v_{max},$$

where $$v_{max}$$

is the highest betatron frequency of the beam. This frequency is fairly low, in the range of thousands of Hertz, for low energy beams.

To actually develop a working quantum computer using a crystalline beam in a storage ring, there must be at least two components to the system; a means to set the initial states and an ability to operate on the quantum information.

An ion trap system is able to set the internal state of the ions to by utilizing optical pumping techniques. Applying this to all ions in the storage ring may be challenging, due to the large number of ions in the beam. All ions in the crystal need to be cooled to the same phonon state. For a single or small number of ions, laser cooling to set the external $|n=0\rangle$ state has been achieved, but for the center-of-mass external mode, cooling all ions to that mode is like cooling a single particle of mass Nm. Changing the external modes is done by changing the laser cooling to different sidebands. One difficulty is dealing with recoil energy upon re-emission (which is distributed over all modes). A number of other cooling methods may improve on this. Methods of interest would include cooling by null detection in fluorescence, Sisyphus cooling, and Raman sideband cooling.

A gate that acts on i qubits is represented by a $2^i \times 2^i$ unitary matrix. A vector representation of a qubit is, $$u_0|0\rangle + u_1|1\rangle \to \begin{bmatrix} u_0 \\ u_1 \end{bmatrix} \quad \text{Equation 41}$$

In the case of a qubit from an internal spin state, this would be expressed as $$u_0|\downarrow\rangle + u_1|\uparrow\rangle \to \begin{bmatrix} u_0 \\ u_1 \end{bmatrix} \quad \text{Equation 42}$$

A single bit rotation gate, operator $R(\theta,\phi)$ transforms the state of the qubit as, $|\downarrow\rangle \to \cos(\theta/2)|\downarrow\rangle - ie^{i\phi}\sin(\theta/2)|\uparrow\rangle$     Equation 43

$|\uparrow\rangle \to \cos(\theta/2)|\uparrow\rangle - ie^{-i\phi}\sin(\theta/2)|\downarrow\rangle$     Equation 44

This transformation can be realized in a storage ring, where the single bit rotation gate is accomplished by tuning the carrier transition $(\omega_L=\omega_0)$ and applying radiation for a time t such that $\theta=2\Omega^i t$.

In this manner, an ion first prepared to state $|\downarrow\rangle$ can be measured in the state $|\downarrow\rangle$ or $|\uparrow\rangle$ A Hadamard gate acts on a single qubit by mapping the qubit states as;

$$|0\rangle \to \frac{|0\rangle + |1\rangle}{\sqrt{2}} \quad \text{Equation 45}$$

$$|1\rangle \to \frac{|0\rangle - |1\rangle}{\sqrt{2}} \quad \text{Equation 46}$$

and in matrix form, $$H = \frac{1}{\sqrt{2}} \begin{bmatrix} 1 & 1 \\ 1 & -1 \end{bmatrix} \quad \text{Equation 47}$$

A measurement than has an equal probability of being either a 1 or 0.

A Pauli gate acts on a single qubit, causing a rotation around one axis of the Block sphere, the superposition, of all possible states of a qubit. An example was given above, for a single bit rotation gate. There are three such possible rotations, $$X = \begin{bmatrix} 0 & 1 \\ 1 & 0 \end{bmatrix}, Y = \begin{bmatrix} 0 & -i \\ i & 0 \end{bmatrix}, Z = \begin{bmatrix} 1 & 0 \\ 0 & -1 \end{bmatrix}, \quad \text{Equation 48}$$

Where they quadratically sum to the identity matrix, $I^2=X^2+Y^2+Z^2=I$     Equation 49

An X gate is a quantum NOT operation. A two-bit controlled-NOT gate is analogous to a classical XOR gate. The gate flips the spin of ion $k(|\downarrow\rangle_k \leftrightarrow |\uparrow\rangle_k)$, But only if ion j is in state $|\uparrow\rangle$.

This is a nontrivial operation and is an example where both the center-of-mass motion and the hyperfine spin states are needed to accomplish the complete logic gate.

A Z gate is basically a phase shift gate with phase of

π rad.

Realizing quantum gates for a storage ring quantum computer is largely an independent topic and beyond. This short overview suggests there are solutions, Future work will focus on developing systems that will allow operations on the qubits from the crystalline beams in a storage ring.

The idea of using storage rings with crystalline beams as quantum computers was discussed above. There are a number of phenomena that could be exploited to produce quantum bits of information. The challenge in building such a computer hinges entirely on how effectively particle beams can be cooled to a sufficient level and on how quickly and reliably the quantum states can actually be set and measured. Conceptually, such a system is the same as an ion trap quantum computer, but with the ions placed in the rotating frame in the circular storage ring.

One or more embodiment relates to a quantum computer using a storage ring containing many positively charged ions, from which a large number of quantum bits of information, or qubits is obtained. Such a storage ring quantum computer will contain thousands of qubits, with the potential of scaling into the tens of thousands or even higher.

FIG. 1 depicts a high-level block diagram of a storage ring, generally designated 10, in accordance with one embodiment of the present invention. FIG. 1 illustrates housing or containment 12 about 1 m in diameter. As illustrated, storage ring 10 includes read and write units 30 coupled to and in communication with storage ring 10. Read and write units 30 enable users to read and write the qubits. Storage ring 10 further includes a unit 32 that allows for injection of the ion beam, a laser 34 for generating and applying one or more laser beams to provide cool the ions to an extremely low temperature so that the quantum states in the motion of the ions are observable, and a diagnostic instrumentation unit 36 all of which are coupled to and communicate with the storage ring 10. It should be appreciated that while two units 30 and one unit 32, 34 and 36 are shown, more than units are contemplated.

In one or more embodiments, the storage ring 10 creates an ultracold beam in the form of an ion Coulomb crystal. In at least one embodiment, the Coulomb crystal binds a chain of ions in to a lattice structure in which the ions remain locked in sequence despite the mutual Coulomb repulsion force between the positively charged ions. In one embodiment of the invention, the ion Coulomb crystal, the thermal vibrations of the ions are cooled to an extremely low temperature, so that the quantum states in the motion of the ions are observable. One or more embodiments further includes employing Doppler and Raman laser cooling.

Figure 2:
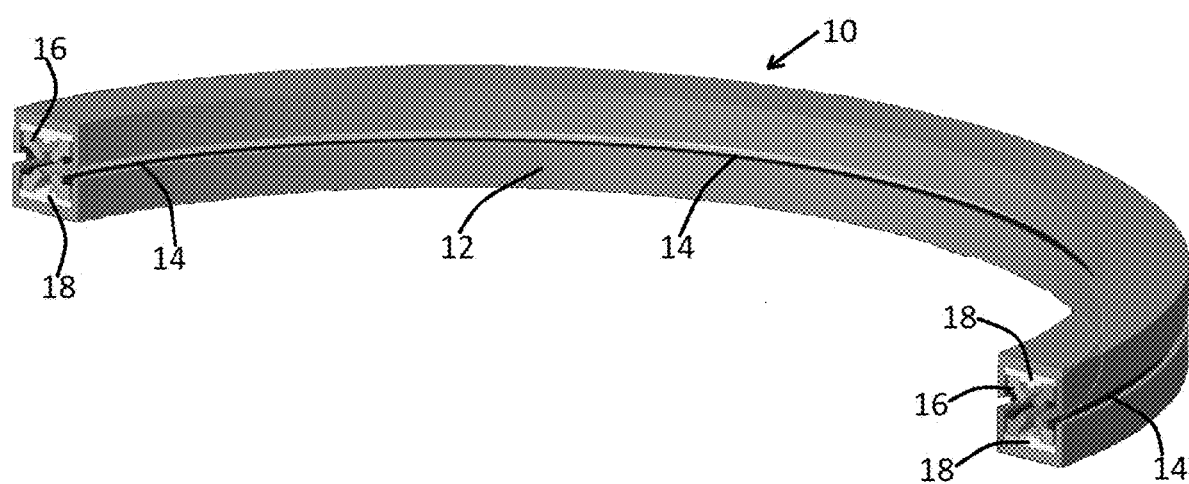
FIG. 2 depicts one half of the storage ring of FIG. 1 in accordance with one embodiment of the present invention.

FIG. 2 depicts one half of the storage ring 10. In the illustrated embodiment, the storage ring 10 having housing or containment 12 is about 1 m in diameter. As illustrated, storage ring 10 includes first ceramic ring 14 and four electrodes 16. In at least one embodiment, electrodes 16 are excited with RF to confine the ions. FIG. 2 further illustrates second ceramic ring 18. In at least on embodiment, first and second ceramic rings 14 and 18 set the permanent alignment of the electrodes, items 16.

Figure 3:
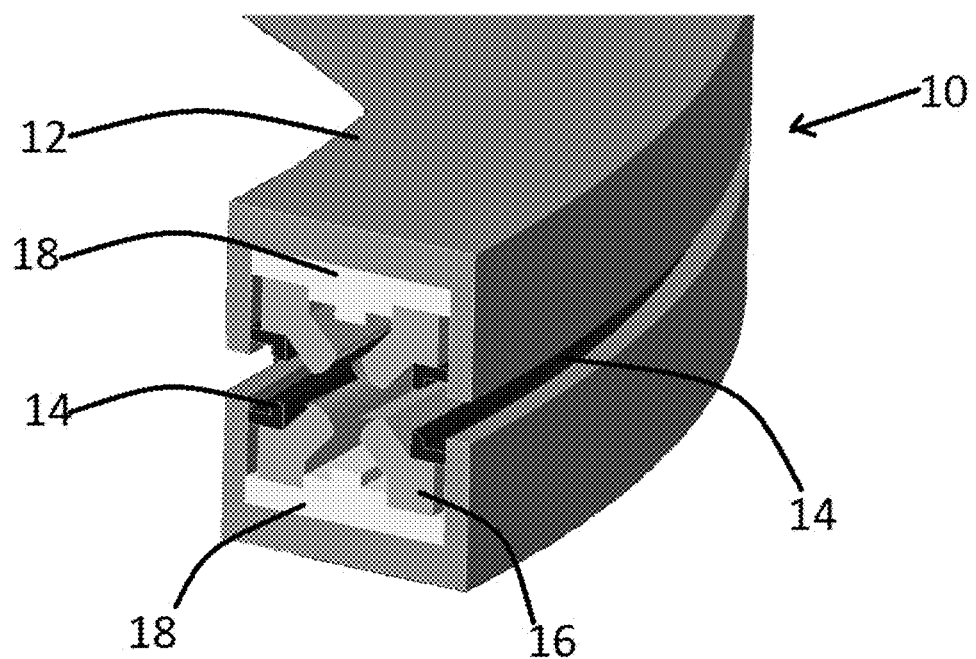
FIG. 3 depicts a cross section of the ring of FIG. 2 in accordance with embodiment.

FIG. 3 depicts a cross section of one embodiment of storage ring 10 of FIG. 2 in accordance with embodiment. FIG. 3 includes the containment 12, first ceramic ring 14, electrodes 16 and second ceramic ring 18. In at least one embodiment The storage ring 10 of FIGS. 1-3 enables an ion velocity of about 100 to 2000 meters per second. This is about equivalent to a revolution of about 1 msec to 10 msec. One or more embodiments enables storage ring 10 to store about 100,000 qubits with a processing rate of about 1 million qubits/sec with lasers.

All publications and patent documents cited in this application are incorporated by reference in their entirety for all purposes to the same extent as if each individual publication or patent document were so individually denoted.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

While the embodiments of the invention disclosed herein are presently considered to be preferred, various changes and modifications can be made without departing from the spirit and scope of the invention. The scope of the invention is indicated in the appended claims, and all changes that come within the meaning and range of equivalents are intended to be embraced therein.

Having described the basic concept of the embodiments, it will be apparent to those skilled in the art that the foregoing detailed disclosure is intended to be presented by way of example. Accordingly, these terms should be interpreted as indicating that insubstantial or inconsequential modifications or alterations and various improvements of the subject matter described and claimed are considered to be within the scope of the spirited embodiments as recited in the appended claims. Additionally, the recited order of the elements or sequences, or the use of numbers, letters or other designations therefor, is not intended to limit the claimed processes to any order except as may be specified. All ranges disclosed herein also encompass any and all possible sub-ranges and combinations of sub-ranges thereof. Any listed range is easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as up to, at least, greater than, less than, and the like refer to ranges which are subsequently broken down into sub-ranges as discussed above.

As utilized herein, the terms "about," "substantially," and other similar terms are intended to have a broad meaning in conjunction with the common and accepted usage by those having ordinary skill in the art to which the subject matter of this disclosure pertains. As utilized herein, the term "approximately equal to" shall carry the meaning of being within 15, 10, 5, 4, 3, 2, or 1 percent of the subject measurement, item, unit, or concentration, with preference given to the percent variance. It should be understood by those of skill in the art who review this disclosure that these terms are intended to allow a description of certain features described and claimed without restricting the scope of these features to the exact numerical ranges provided. Accordingly, the embodiments are limited only by the following claims and equivalents thereto. All publications and patent documents cited in this application are incorporated by reference in their entirety for all purposes to the same extent as if each individual publication or patent document were so individually denoted

What is claimed is:

1. A method of storing information in a quantum computer using a quantum storage ring, the method comprising:
    cooling ions in the quantum storage ring to a low temperature of about $5.15 \times 10^{-5}$° K; and
    binding the ions into a lattice structure, forming an ion Coulomb crystal.

2. The method of claim 1 wherein the ions are cooled to a low temperature using one or more lasers.

3. The method of claim 1 further comprising reading and writing qubits to the storage ring.

4. A quantum storage ring, the quantum storage ring comprising:
    a containment about 1 meter in diameter;
    at least one laser for cooling ions in the storage ring such that thermal vibrations of ions are cooled to an extremely low temperature, so that the quantum states in motion of the ions are observable, and
    electrodes adapted to be excited with RF signals.

5. The quantum storage ring of claim 4 further comprising four electrodes.

6. The quantum storage ring of claim 4 wherein the at least one laser comprises at least one of a Doppler and Raman laser.

7. The quantum storage ring of claim 4 wherein the at least one laser provides sideband cooling for confined ions.

8. The quantum storage ring of claim 4 further including a unit that allows for injection of the ion beam.

9. A quantum computer having a storage device, the storage device comprising:
    a containment in the shape of a ring about 1 meter in diameter,
    at least one laser for cooling ions in the storage ring such that thermal vibrations of ions are cooled to an extremely low temperature, so that the quantum states in motion of the ions are observable; and
    four electrodes adapted to be excited with RF.

10. The quantum computer of claim 9 further includes read and write units coupled to and in communication with storage ring.

11. A quantum storage ring, the quantum storage ring comprising:
    a containment about 1 meter in diameter;

read and write units coupled to and in communication with storage ring; and electrodes adapted to be excited with RF signals.

12. The quantum storage ring of claim 11 further comprising four electrodes.

13. The quantum storage ring of claim 11 further including at least one laser for cooling ions in the storage ring such that thermal vibrations of ions are cooled to an extremely low temperature, so that the quantum states in motion of the ions are observable.

14. The quantum storage ring of claim 11 wherein the at least one laser comprises at least one of a Doppler and Raman laser.

15. The quantum storage ring of claim 11 wherein the at least one laser provides sideband cooling for confined ions.

* * * * *